United States Patent [19]
Freyhardt et al.

[11] Patent Number: 5,846,911
[45] Date of Patent: Dec. 8, 1998

[54] METHOD OF PRODUCING A HIGH-TEMPERATURE SUPERCONDUCTIVE COATING ON AN ELONGATED SUBSTRATE

[75] Inventors: Herbert C. Freyhardt; Alexander Usoskin; Francisco Garcia-Moreno, all of Göttingen, Germany

[73] Assignee: Alcatel Alsthom Compagnie Generale d'Electricite, France

[21] Appl. No.: 889,236

[22] Filed: Jul. 8, 1997

[30] Foreign Application Priority Data

Jul. 11, 1996 [DE] Germany .................. 196 27 962.3

[51] Int. Cl.⁶ .................................................. H01L 39/24
[52] U.S. Cl. .......................... 505/434; 505/433; 505/430; 505/474; 505/230; 505/704
[58] Field of Search ...................... 505/434, 704, 505/230, 433, 474, 430; 427/62, 596; 29/599; 174/125.1

[56] References Cited

U.S. PATENT DOCUMENTS 5,372,991  12/1994  Hayashi et al. ..................... 505/211

FOREIGN PATENT DOCUMENTS 37 30 766 A1  3/1989  Germany .
42 28 573 C1  2/1994  Germany .

Primary Examiner—Roy V. King
Attorney, Agent, or Firm—Ware, Fressola, Van der Sluys & Adolphson LLP

[57] ABSTRACT

A method of producing a superconductive coating (19) on an elongated substrate (12) is indicated, whereby the substrate (12) is drawn through a deposition chamber (1) in which it is also heated in a heating zone (2) and is coated with a superconducting material. To improve the current carrying capacity, the substrate (12) is coated with the superconducting material in a geometric form which differs from the use of the finished product in a way so that a compressive strain is created in the substrate plane of the superconductive coating (19) for the geometric form of the substrate (12) taking place when it is put to use.

19 Claims, 3 Drawing Sheets

METHOD OF PRODUCING A HIGH-TEMPERATURE SUPERCONDUCTIVE COATING ON AN ELONGATED SUBSTRATE

BACKGROUND OF THE INVENTION

1. Technical Field

The invention concerns a method of producing a superconductive coating on an elongated substrate whereby the substrate is drawn through a deposition chamber in which it is heated in a heating zone, and where the substrate is coated in the heating zone with a superconducting material.

2. Description of the Prior Art

The effect of superconduction has been known for a long time. In the case of superconduction, the electric resistance of a metal conductor disappears below a predetermined critical temperature, at least with direct current. The critical temperature of the material $Nb_3Sn$ is 18.2 K for example. Helium is the usual cooling medium. Electric current can be transmitted through superconductors almost without any loss. In addition to the production, one problem is how to maintain the low temperatures in the vicinity of the conductor.

The search therefore continues for superconductive materials which already become superconductive at less low temperatures. Such high-temperature superconducting materials (HTSC) have critical temperatures above 77 K. They contain the components yttrium, barium, copper and oxygen for example. The HTSC materials can be deposited on a heated substrate for example by means of a pulsed laser beam, through plasma evaporation, thermal evaporation or chemically. According to DE 42 28 573 C1, the quality and reproducibility of the coatings produced with the known method are inadequate. Add to this that the current carrying capacity of the coatings is relatively low while the superconductivity is being maintained. The magnitude of the transmissible currents is limited accordingly.

The known method of the above-mentioned DE 42 28 573 C1 improves the quality and reproducibility of the produced HTSC coatings. The coating produced by means of a pulsed source is intermittent in this method. The coating results in uniform temperature ratios for the substrate and the pulsed coatings, whereby the indicated improvement is achieved. However, the thus produced HTSC coatings also have a low current carrying capacity.

SUMMARY OF THE INVENTION

It is an object of the invention to further develop the above-described method so that a higher current carrying capacity can be achieved. This object is fulfilled by the invention in that the substrate is coated with the superconducting material in a geometric form which differs from the use of the finished product in a way so that a compressive strain is produced in the substrate plane of the superconductive layer for the geometric form of the substrate when it is put to use.

When this method is used, the superconducting material is applied to the substrate in a way so that it is placed under a compressive strain when it takes on the form or shape corresponding to its respective usage. Surprisingly, it was shown that the current carrying capacity of the produced HTSC material was significantly increased by this measure alone. This is particularly surprising because, in contrast to ceramic HTSC material (DE 37 30 766 A1), an HTSC film has a high density microstructure with a low intercrystalline porosity of not more than 0.1% by volume. A possible explanation for the described improvements of the critical current densities can be that a change takes place in the electronic or phononic structure of the deformed crystal, caused by a reduction of the a- (b-) lattice parameter and an increase in the c-axial parameter. A new arrangement of the pinning centers could also occur during the I-dimensional deformation. Because of the higher currents made possible by the use of this method, a corresponding superconductor can be used in newer or wider technical areas.

To carry out the method, the superconductive coating can be applied to a substrate on which the surface area to be coated is stretched for example, which is then released and returns to its original condition. For example the substrate can be bent to stretch its surface. Since the substrate unbends after it has been coated, the coated surface and the applied superconductive coating receive a compressive strain which is effective in the substrate plane (i.e., in a longitudinal direction of the superconductive coated elongated substrate), resulting in the increased current carrying capacity of the HTSC material.

It is also possible to coat the substrate while in the linear condition and subsequently wind it into a coil. The superconductive coating placed under compressive strain in this manner produces a coil with increased current carrying capacity.

The invention will be fully understood when reference is made to the following detailed description taken in conjunction with the accompanying drawings.

DETAILED DESCRIPTION OF THE INVENTION

Figure 1:
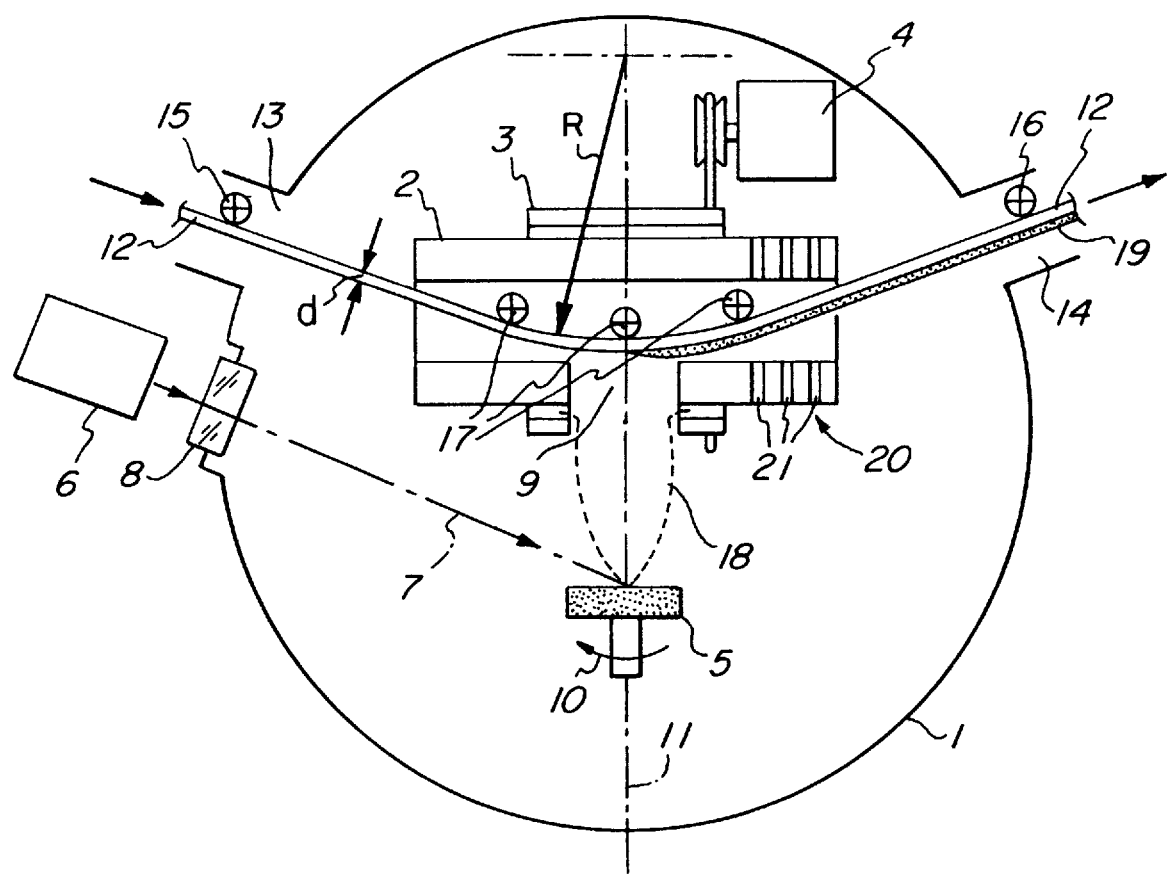
FIG. 1 is a schematic illustration of a device for carrying out the method of the invention.

The superconductive coating can basically be applied to any substrate by means of any known method. The coating method using a pulsed laser is explained hereinafter and represents all possible methods. The substrate can have different forms, for example a coil, a spiral or a tape. The following considers the tape as representative of all possible configurations.

A vacuum is produced and maintained in a deposition chamber 1, hereinafter called briefly "chamber 1", in which an oxygen atmosphere is maintained for example at a pressure of 0.5 mbar. The chamber 1 contains a heating zone 2, a diaphragm 3 which surrounds same, an electric motor 4 and a target 5 which supports a superconducting material. A laser beam 7 emitted by a pulsed laser 6 can enter the chamber 1 through a window 8. The laser beam 7 strikes the target 5. The tube-shaped heating zone 2 has an opening 9 which can be opened and closed by the rotating diaphragm 3. To that end, the diaphragm 3 can be rotated around its axis by the motor 4. The target 5 can also be arranged to rotate in the chamber 1, which is indicated by the arrow 10. It is preferably arranged at a distance from the heating zone 2 symmetrical with a line 11 which passes through the center of the opening 9.

A substrate 12 made of a multi-crystalline material, hereinafter called "tape 12", is drawn through the chamber 1 in the direction indicated by the arrows. It enters the chamber 1 through an opening 13, passes through the heating zone 2 and leaves the chamber 1 through an opening 14. The tape 12 is guided by rollers 15 and 16 in the openings 13 and 14 of the chamber 1, and by rollers 17 in the heating zone 2. The illustrated configuration example has three rollers 17.

The rollers 17 are arranged in the heating zone 2 so that the tape 12 when it is drawn along its lengthwise direction passes through them in a bent manner. In the bent area the bending radius of the tape 12 is indicated by R. The apex of the bend is in line with the opening 9 of heating zone 2 and therefore also in line with the target 5.

To carry out the method of the invention with the device illustrated in FIG. 1 the laser 6 and the heating zone 2 are switched on first. The laser beam 7 striking the target 5 loosens particles of the superconducting material from its surface, and a plasma jet 18 indicated by a broken line precipitates them onto the tape 12. In this way the tape 12 which is drawn through the heating zone 2 receives a coating 19 of superconducting material.

The superconducting material is applied to the bent area of the tape 12. This bent area begins approximately at the place where the tape 12 enters the heating zone 2. It ends approximately in its outlet area where the heating is preferably reduced. This is indicated by the illustrated openings 21. In this way, the tape 12 with the coating 19 already cools in the outlet area 20 of the heating zone 2. This makes the cohesion between tape 12 and coating 19 sufficiently strong when the tape 12 is straightened out again. The compressive strain created in this manner in the coated surface of the tape 12 on the one hand and in the coating 19 on the other hand, causes the increase in the current carrying capacity of the finished HTSC tape.

During the coating, the diaphragm 3 can be rotated around its axis by the motor 4. It thus functions as a rotating infrared shield which is synchronized with the laser pulses so that the tape 12 periodically is uncovered for a short period of time. In each case, the transfer of material from the target 5 to the tape 12 takes place during that time by means of a particle beam. Improved temperature conditions are achieved in the precipitation area in this manner according to DE 42 28 573 C1. The quality and reproducibility of the precipitation are also improved thereby.

Bending the tape 12 within the heating zone 2 causes it to undergo an elastic deformation which is approximately between 0.01% and 0.6%. The respective deformation of the tape 12 can be calculated with the equation:

$$R = d/2\delta$$

In that case, R is the bending radius, d the thickness of the tape 12 and $\delta$ an absolute deformation number which is between 0.0001 and 0.006.

FIGS. 2 to 5 illustrate the different possibilities of forming the tape 12 during the coating, and several applications for the tape 12 with the superconductive coating 19. The same parts as in FIG. 1 carry the same symbols.

Figure 2:
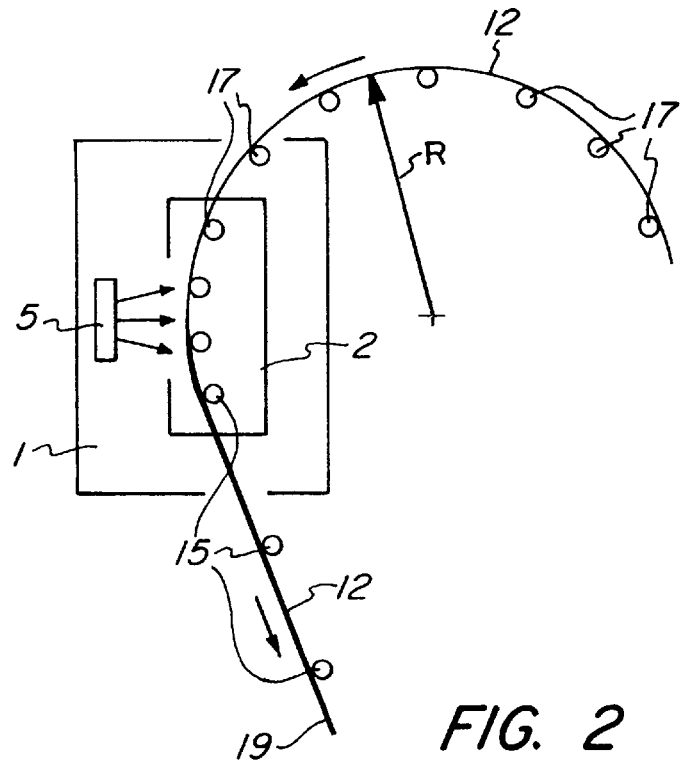
FIGS. 2, 3, 4 and 5 are different possibilities of coating a substrate.

FIG. 2 illustrates an arrangement which essentially corresponds to the device in FIG. 1. The bent tape 12 is guided over a number of rollers 17 through the heating zone in the direction shown by the arrows. In this case, it is bent at a radius R which satisfies the equation:

$$R = 2k/d$$

where d is the thickness of the tape 12. The factor k takes the allowable elastic deformation of the tape 12 into consideration. It is between 0.01% and 0.6%. The tape 12 is coated with the superconducting material in the heating zone 2. After it leaves the heating zone 2, the tape 12 with the superconductive coating 19 is straightened out by the rollers 15. The superconducting material is compressed in this manner. When used in the straightened out condition, the thus produced HTSC superconductor has increased current carrying capacity.

Figure 3:
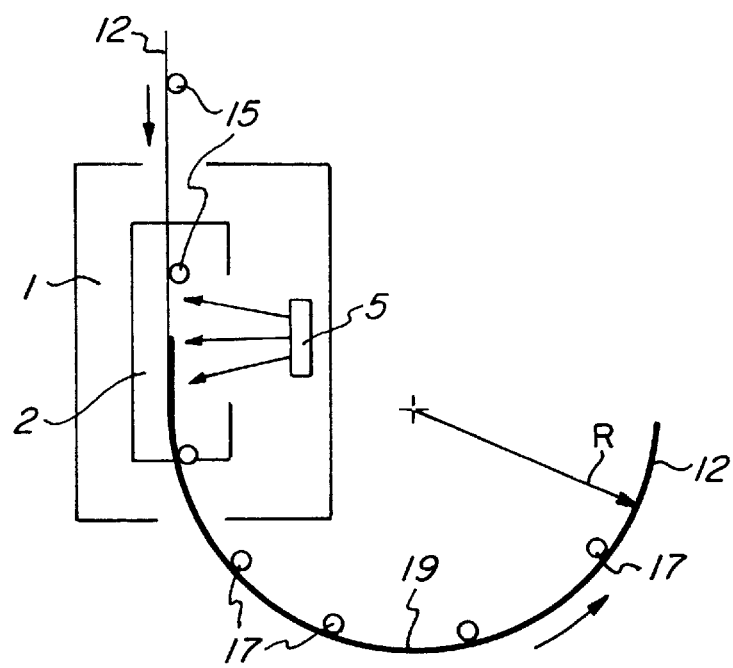

The tape 12 is straight in the arrangement of FIG. 3 and moves in the direction of the arrows through the rollers 15 into the heating zone 2, where it is coated with the superconducting material. After it leaves the heating zone 2, the tape 12 is again bent by the rollers 17 at radius R. In this case the superconductive coating 19 is on the inside so that its material is compressed. The bent HTSC superconductor is able to conduct higher currents.

Figure 4:
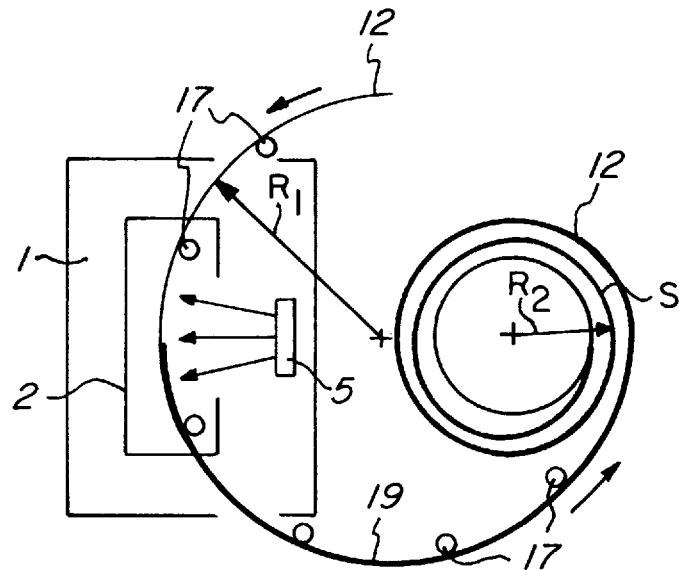

In the configuration of FIG. 4, the tape 12 which is bent at radius $R_1$ and is guided by the rollers 17 is drawn through the heating zone 2. It is coated with superconducting material on the inside in regard to the bend. The tape 12 with the superconductive coating 19 is then wound into a coil with a radius $R_2$. $R_2$ is smaller than $R_1$. In this way, the material of the coating 19 is given a compressive strain in the coil S. The superconductive coil S has increased current carrying capacity.

Figure 5:
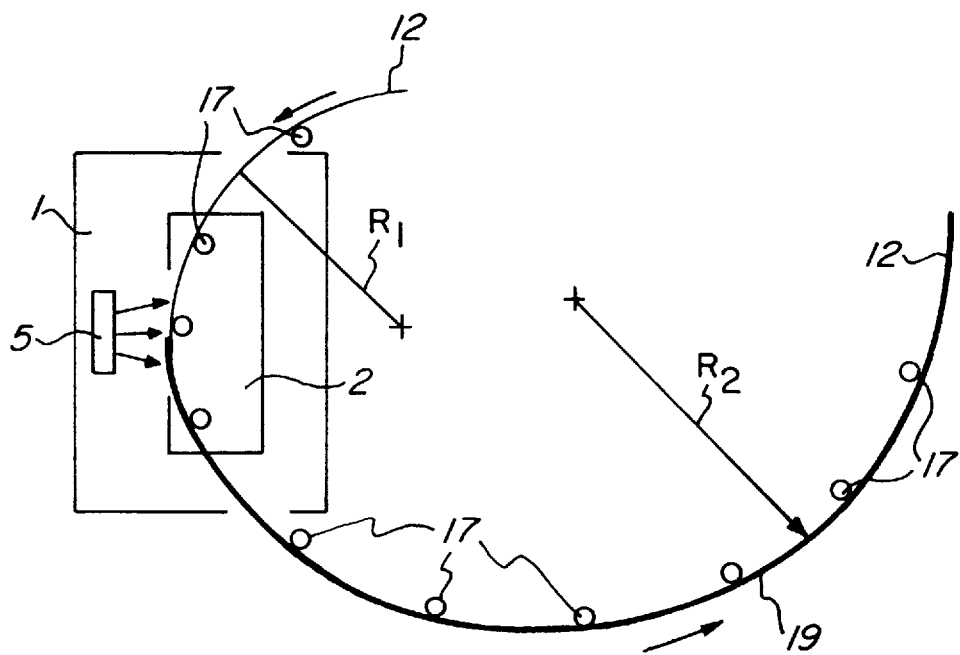

In contrast to FIG. 4, the tape 12 according to the arrangement in FIG. 5 is coated with the superconducting material on the outside. It is bent at the radius $R_1$, drawn through the heating zone 2 and subsequently "expanded" to the radius $R_2$ which is larger than radius $R_1$. At that time the material of the superconductive coating 19 is compressed. This HTSC superconductor is also able to conduct higher currents.

The following relationship applies to the radii $R_1$ and $R_2$:

$$R_1/R_2 = [1 \pm 2k\, R_2/d]^{-1}$$

where d is the thickness of the tape 12 and k is a factor that takes its elastic deformation into consideration. The + sign applies to the outside coating of FIG. 5 and the – sign applies to the inside coating of FIG. 4.

The tape 12 can be a 0.12 mm thick nickel foil for example or a 0.125 mm thick tape of a zirconium ceramic stabilized with yttrium. Both "substrates" are provided with a buffer coating of zirconium stabilized with yttrium. The temperature in the precipitation area is approximately 770° C. It is approximately 20° C. to 40° C. in the outlet area 20. The coating 19 is applied at a rate of 0.5 to 1.0 nm/s. The tape 12 is drawn at a speed of 0.8 cm/h. The material for the tape 12 can also be a bimetallic material in which the bend results automatically due to different temperatures during the coating.

The method of the invention leads to the following results indicated by two examples:

EXAMPLE 1

A 0.12 mm thick nickel foil is bent in the coating area at a radius R of 40 mm. The number $\delta$ is 0.0015. A critical temperature of 89.2 K and a current carrying capacity of $1.8 \times 10^4$ A/cm$^2$ are the result of the finished HTSC tape. The current carrying capacity is higher by a factor of 2 approximately than with the previous technology.

EXAMPLE 2

A 0.125 mm thick tape of a zirconium ceramic stabilized with yttrium is bent at a bending radius R of 30 mm in the coating area. The number $\delta$ is 0.0021. A critical temperature of 89.8 K and a current carrying capacity of $0.4 \times 10^6$ A/cm$^2$ are the result of the finished HTSC tape. The current carrying capacity is higher by a factor of 1.4 approximately than with the previous technology.

The preferred embodiments described above admirably achieve the objects of the invention. However, it will be appreciated that departures can be made by those skilled in the art without departing from the spirit and scope of the invention which is limited only by the following claims.

What is claimed is:

1. A method of producing a high-temperature superconductive coating on an elongated substrate, the method comprising the steps of:
   (a) drawing the elongated substrate through a deposition chamber;
   (b) heating the elongated substrate in a heating zone in the deposition chamber;
   (c) coating the elongated substrate with high-temperature superconducting material in the heating zone to produce a superconductive elongated substrate, the superconductive coated elongated substrate having a first non-flat geometric form during the coating step;
   (d) cooling down said substrate with the superconducting coating; and
   (e) bending the superconductive coated elongated substrate into a second geometric form, which differs from the first geometric form, thereby producing a compressive strain in the superconductive coating and a capacity to carry higher current in said coating than in said first geometric form, while retaining superconductivity.

2. A method as claimed in claim 1, wherein
   the elongated substrate is elastically deformed during the coating step to stress a surface of the elongated substrate and
   when it is put to use, the superconductive coated elongated substrate is deformed to the second geometric form so that the stress on the surface of the elongated substrate is released.

3. A method as claimed in claim 2, wherein the deformation of the elongated substrate starts before the coating step and extends to a cooling area which follows the heating zone.

4. A method as claimed in claim 3, wherein the elongated substrate is guided by rollers and is bent during the coating step to produce the deformation in the elongated substrate.

5. A method as claimed in claim 4, wherein the elongated substrate is deformed linearly between 0.01% and 0.6% during deformation.

6. A method as claimed in claim 2, wherein the elongated substrate is guided by rollers and is bent during the coating step to produce the deformation in the elongated substrate.

7. A method as claimed in claim 6, wherein the elongated substrate is deformed linearly between 0.01% and 0.6% during deformation.

8. A method as claimed in claim 1, wherein the elongated substrate is first bent at a radius $R_1$,
   after that the elongated substrate is coated with a superconducting material, and
   when put into use, the superconductive coated elongated substrate is bent at a radius $R_2$ which deviates from radius $R_1$.

9. A method as claimed in claim 8, wherein both radii $R_1$ and $R_2$ behave as:

$$R_1/R_2 = [1 \pm 2k\, R_2/d]^{-1}$$

where d is the thickness of the elongated substrate and k is a factor that takes the elastic deformation of the elongated substrate into consideration, and that the + sign takes an outside coating into consideration and the − sign an inside coating.

10. A method as claimed in claim 1, wherein an elongated substrate containing a multi-crystalline material is used.

11. A method as claimed in claim 1, wherein a nickel foil is used as the elongated substrate.

12. A method as claimed in claim 1, wherein a tape of zirconium ceramic stabilized with yttrium is used as the elongated substrate.

13. A method as claimed in claim 1, wherein a bimetallic material is used as the elongated substrate.

14. A method as claimed in claim 1, wherein the elongated substrate is deformed linearly between 0.01% and 0.6% during the elastic deformation.

15. A method as claimed in claim 1, wherein the superconductive coated elongated substrate is exposed to a temperature of up to 400° C. when the superconductive coated elongated substrate is provided with the second geometric form to produce the compressive strain in the superconductive coating.

16. A method as claimed in claim 1, wherein the compressive strain in the superconductive coating is in a longitudinal direction of the superconductive coated elongated substrate.

17. A method as claimed in claim 1, wherein said capacity to carry current in said second geometric form exceeds capacity to carry current in said first geometric form by a factor of at least 1.4.

18. A method of producing a high-temperature superconductive coating on an elongated substrate, the method consisting essentially of the steps of:
   (a) drawing the elongated substrate through a deposition chamber;
   (b) heating the elongated substrate in a heating zone in the deposition chamber;
   (c) coating the elongated substrate with high-temperature superconducting material in the heating zone to produce a superconductive elongated substrate, the superconductive coated elongated substrate having a first geometric form during the coating step;
   (d) cooling down said substrate with the superconducting coating; and
   (e) bending the superconductive coated elongated substrate into a second geometric form, which differs from the first geometric form, thereby producing a compressive strain in the superconductive coating and a capacity to carry higher current in said coating than in said first geometric form, while retaining superconductivity, wherein the elongated substrate is coated in a linear condition and bent so that the superconducting coating is on an inside portion thereof.

19. A method as claimed in claim 18, wherein the elongated substrate is bent to satisfy:

$$R = 2k/d$$

where R is the radius of the substrate, d is the thickness of the elongated substrate and k is a factor that takes the elastic deformation of the elongated substrate into consideration.

* * * * *